(12) United States Patent
Hirata

(10) Patent No.: US 7,363,706 B2
(45) Date of Patent: Apr. 29, 2008

(54) METHOD OF MANUFACTURING A MULTILAYER PRINTED WIRING BOARD

(75) Inventor: Eiji Hirata, Isesaki (JP)

(73) Assignee: CMK Corporation, Tokyo (JP)

( * ) Notice: Subject to any disclaimer, the term of this patent is extended or adjusted under 35 U.S.C. 154(b) by 55 days.

(21) Appl. No.: 11/210,860

(22) Filed: Aug. 25, 2005

(65) Prior Publication Data

US 2006/0137904 A1 Jun. 29, 2006

(30) Foreign Application Priority Data

Dec. 27, 2004 (JP) ............................ 2004-376564

(51) Int. Cl.
*H01K 3/10* (2006.01)
*H05K 1/14* (2006.01)
*H05K 1/11* (2006.01)

(52) U.S. Cl. .......................... 29/852; 29/847; 361/736; 361/792

(58) Field of Classification Search ................ 361/679, 361/728, 736, 737, 139, 143, 146, 748, 749, 361/750, 751; 174/126.3, 250, 255; 29/842, 29/846, 847, 852
See application file for complete search history.

(56) References Cited

U.S. PATENT DOCUMENTS 5,260,517 A * 11/1993 Cathey ........................ 174/250

| | | | |
|---|---|---|---|
| 5,886,877 A * | 3/1999 | Shingai et al. .............. | 361/768 |
| 6,005,766 A * | 12/1999 | Muraki ....................... | 361/679 |
| 6,534,723 B1 * | 3/2003 | Asai et al. .................. | 174/255 |
| 6,802,120 B2 * | 10/2004 | Uehara ........................ | 29/852 |
| 2005/0157475 A1 * | 7/2005 | Edwards ..................... | 361/748 |
| 2006/0022341 A1 * | 2/2006 | Sir et al. .................... | 257/758 |
| 2006/0202346 A1 * | 9/2006 | Shih et al. .................. | 257/774 |

FOREIGN PATENT DOCUMENTS

| JP | 2003-304067 | 10/2003 |
|---|---|---|
| JP | 2004-319994 | 11/2004 |

\* cited by examiner

*Primary Examiner*—Ishwar Patel
*Assistant Examiner*—Sheldon S Soon
(74) *Attorney, Agent, or Firm*—Oblon, Spivak, McClelland, Maier & Neustadt, P.C.

(57) ABSTRACT

This invention provides a multilayer printed wiring board having flat via holes. This is a multilayer printed wiring board formed by alternately laminating multiple metal foils and insulating layers, in which an interlayer connection via pad provided in a first insulating layer, a wiring circuit and an interlayer connection via bottom pad of a second insulating layer are provided in the same surface layer and at least the interlayer connection via pad and the interlayer connection via bottom pad of the second insulating layer have the same thickness.

8 Claims, 3 Drawing Sheets

BACKGROUND ART

METHOD OF MANUFACTURING A MULTILAYER PRINTED WIRING BOARD

BACKGROUND OF THE INVENTION

1. Field of the Invention

The present invention relates to a multilayer printed wiring board which has high connection reliability of interlayer connection vias and permits high-density wiring and a method of manufacturing this multilayer printed wiring board.

2. Description of the Related Art

Methods of forming a circuit in a printed wiring board are divided into the subtractive method which involves forming an etching resist on a metal conductor layer of copper foil etc. and forming a wiring circuit by etching the part of metal conductor layer not covered by this etching resist; and the additive method which involves forming a plating resist of a pattern reverse to a circuit and forming a wiring circuit by precipitating a plating on an opening of this plating resist.

Because the manufacturing steps in the subtractive method are easier than in the additive method, it is possible to manufacture circuits at low cost. However, in the subtractive method it is necessary to apply a nonelectrolytic plating and an electrolytic plating to the whole insulating substrate in forming full through holes and blind via holes and the like (hereinafter referred to as via holes) and, therefore, the thickness of the conductor layer to be etched equals to the sum of metal foil plus a plating. Thus, the subtractive method was not very suitable for the formation of a good fine wiring circuit, for example, a wiring circuit having L/S (line/space) of not more than 75 µm/75 µm.

In contrast, the additive method, which is favorable for the formation of a fine wiring circuit, requires that a wiring circuit be formed by precipitating a plating on an insulating layer and, therefore, compared to a case as in the subtractive method where an insulating substrate in which metal foil has been laminated on an insulating layer is processed, the additive method had problems such that the adhesion of the wiring circuit is poor.

Furthermore, in terms of the design of printed wiring circuits, wiring circuits are formed nonuniformly in the plane of the substrate and, therefore, when wiring circuits are formed by selective plating as in the additive method, currents are concentrated more than necessary in portions of coarse wiring circuits and variations occur in the thickness of wiring circuit, thereby posing problems such that it is difficult to ensure impedance matching.

As methods of manufacturing printed wiring boards to solve such problems, there has already been reported, for example, a technique as disclosed in JP-A-2004-319994.

That is, the method including forming a wiring circuit in the part of metal foil beforehand, forming then at least a barrier layer substantially on the whole upper area followed by forming a nonthrough hole, and applying first a nonelectrolytic plating and then an electrolytic plating substantially to the whole area including via holes, thereby forming via holes. By this method it is possible to form via holes of high connection reliability at the same time with the formation of a fine wiring circuit.

In the above-described conventional method, in particular, materials with a metal foil thickness of 12 µm, 9 µm and 7 µm are used when the line/space of a fine wiring circuit decreases from 30 µm to 20 µm and 10 µm, respectively.

In this method, when a wiring circuit is refined and the thickness of metal foil is reduced, an insulating layer is laminated on an upper layer and the wiring circuit and via holes are connected. When a wiring circuit is used as a via hole bottom pad of an insulating layer of the upper layer, because of thinness of the metal foil, this posed the problem that when a nonthrough hole is formed by laser processing for example, it becomes impossible to form the nonthrough hole which pierces through the via hole bottom pad. That is, a depression as indicated by C in FIG. 4 is formed, making it impossible to maintain interlayer connection.

The metal foil height of each layer in a case where a via hole is superposed on a via hole differs from that in a case where a via hole is formed on metal foil. For example, when a via hole is provided on metal foil, this posed the problem that the interior of the via hole is not sufficiently filled with a metal plating, resulting in the formation of a recessed portion. That is, a recess as indicated by D in FIG. 5 is formed.

In view of the above-described problems and actual situation, the present invention has as its object the provision of a multilayer printed wiring board provided with flat via holes.

SUMMARY OF THE INVENTION

To achieve the above object, the present invention provides a multilayer printed wiring board formed by alternately laminating multiple insulating layers and metal foils, in which an interlayer connection via pad provided in a first insulating layer, a wiring circuit and an interlayer connection via bottom pad of a second insulating layer are provided in the same surface layer and at least the interlayer connection via pad and the interlayer connection via bottom pad of the second insulating layer have the same thickness.

Owing to this construction, the depth of nonthrough holes of via holes is the same; and therefore, interlayer connection vias of multiple insulating layers also become flat.

To achieve the above object, the present invention provides a multilayer printed wiring board, in which the interlayer connection via pad of the first insulating layer and the interlayer connection via bottom pad of the second insulating layer are formed from metal foil, a barrier layer and a metal plating.

Owing to this construction, it is possible to form a fine circuit by metal foil, and the thickness of the interlayer connection via pad becomes equal to the thickness of the interlayer connection via bottom of the insulating layer of the upper layer, resulting in improved connection reliability of via holes.

To achieve the above object, the present invention provides a multilayer printed wiring board, in which the barrier layer is formed from a nonelectrolytic plating of the same kind as the metal foil plus a electrolytic nickel plating, a nonelectrolytic plating of the same kind as the metal foil plus an electrolytic silver plating or a nonelectrolytic plating of the same kind as the metal foil plus an electrolytic tin plating.

Owing to this construction, the fine circuit formed from metal foil is protected by the barrier layer, and variations in wiring circuits do not occur any more and impedance control becomes easy.

To achieve the above object, the present invention provides a multilayer printed wiring board, in which the barrier layer is formed from a nonelectrolytic nickel plating, a nonelectrolytic silver plating or a nonelectrolytic tin plating.

Owing to this construction, the protection of the fine circuit formed from metal foil by the barrier layer is enhanced, variations in wiring circuits do not occur any more and impedance control becomes easier.

To achieve the above object, the present invention provides a multilayer printed wiring board, in which the interlayer connection via pad of the first insulating layer and the interlayer connection via bottom pad of the second insulating layer are formed from metal foil plus a nonelectrolytic plating of the same kind as the metal foil plus an electrolytic plating of the same kind as the metal foil.

Owing to this construction, a plating resist can be used in place of a barrier layer; and therefore, variations in wiring circuits do not occur any more and impedance control becomes easier.

To achieve the above object, the present invention provides a method of manufacturing a multilayer printed wiring board, which involves the steps of: preparing an insulating substrate, the front and back surfaces of which have a metal foil and forming a circuit by laminating a first insulating layer and the metal foil at least on one surface of the insulating substrate; forming a first nonthrough hole for a first interlayer connection in the at least one surface; forming a first barrier layer in the whole area of the at least one surface and the first nonthrough hole; forming a metal plating in the whole area of the first barrier layer; forming an etching resist in an interlayer connection via pad portion and an interlayer connection via bottom pad portion of an interlayer insulating layer of an upper layer; etching the metal plating thereby to remove an excess of the metal plating; exfoliating the etching resist; removing an exposed first barrier layer; forming a second insulating layer and a metal layer; forming a circuit; forming a second nonthrough hole for a second interlayer connection; forming a second barrier layer in the whole area of the circuit, the second nonthrough hole, and the second insulating layer; forming a metal plating in the whole area of the second barrier layer; forming an etching resist in an interlayer connection via pad portion for circuit formation in an outermost layer; removing an excess metal plating; exfoliating the etching resist; and removing the second barrier layer.

With this manufacturing method, the depth of nonthrough holes of via holes is the same; and therefore, interlayer connection vias of multiple insulating layers also become flat.

To achieve the above object, the present invention provides a method of manufacturing a multilayer printed wiring board, in which the barrier layer formed substantially in the whole upper area is formed from a nonelectrolytic plating of the same kind as the metal foil plus an electrolytic nickel plating, a nonelectrolytic plating of the same kind as the metal foil plus an electrolytic silver plating or a nonelectrolytic plating of the same kind as the metal foil plus an electrolytic tin plating.

With this manufacturing method, the fine circuit formed from metal foil is protected by the barrier layer; and therefore, it becomes easy to form via holes from a fine circuit and a metal plating.

To achieve the above object, the present invention provides a method of manufacturing a multilayer printed wiring board, in which the barrier layer formed substantially in the whole upper area is formed from a nonelectrolytic nickel plating, a nonelectrolytic silver plating or a nonelectrolytic tin plating.

With this manufacturing method, the metal foil forms a barrier layer by a dissimilar metal; and therefore, selective etching becomes possible and fine circuits can be easily formed by the subtractive method.

To achieve the above object, the present invention provides a method of manufacturing a multilayer printed wiring board, in which the nonthrough hole for interlayer connection is formed by a laser.

With this manufacturing method, it is possible to perform hole making efficiently by leaving a metal plating in the bottom pad of a nonthrough hole.

To achieve the above object, the present invention provides a method of manufacturing a multilayer printed wiring board, in which the nonthrough hole for interlayer connection is formed by exposure and development.

With this manufacturing method, even in a case where the number of holes is large, the processing time is short and productivity is improved.

To achieve the above object, the present invention provides a method of manufacturing a multilayer printed wiring board, which involves the steps of: preparing an insulating substrate the front and back surfaces of which have a metal foil and forming a circuit on the insulating substrate; forming a first nonthrough hole for interlayer connection; forming a first nonelectrolytic metal plating substantially in the whole area of the front surface; forming a first electrolytic metal plating substantially in the whole area of the first nonelectrolytic metal; forming an etching resist in an interlayer connection via pad portion and an interlayer connection via bottom pad portion of an interlayer insulating layer of an upper layer; etching the metal plating thereby to remove an excess of the metal plating; exfoliating the etching resist; further forming an insulating layer and a metal layer; forming a circuit; forming a second nonthrough hole for interlayer connection; forming a second nonelectrolytic metal plating substantially in the whole area of the circuit, the second nonthrough hole, and the insulating layer; forming a second electrolytic metal plating substantially in the whole area of the second nonelectrolytic metal; forming an etching resist in an interlayer connection via pad portion for circuit formation in an outermost layer; removing an excess of metal plating; and exfoliating the etching resist.

With this manufacturing method, the depth of nonthrough holes of via holes is the same; and therefore, interlayer connection vias of multiple insulating layers also become flat.

To achieve the above object, the present invention provides a method of manufacturing a multilayer printed wiring board, in which the nonthrough hole for interlayer connection is formed by a laser.

With this manufacturing method, it is possible to perform hole making efficiently by leaving a metal plating in the bottom pad of a nonthrough hole.

To achieve the above object, the present invention provides a method of manufacturing a multilayer printed wiring board, in which the nonthrough hole for interlayer connection is formed by exposure and development.

With this manufacturing method, even in a case where the number of holes is large, the processing time is short and productivity is improved.

According to the present invention, fine circuits can be formed by reducing the conductor thickness to the wiring circuits from metal foil alone by the subtractive method, and by ensuring that the interlayer connection via hole pad and the interlayer connection via pad bottom have the same thickness, it is possible to provide a multilayer printed wiring board having flat via holes.

DETAILED DESCRIPTION OF THE PREFERRED EMBODIMENTS

Figure 1:
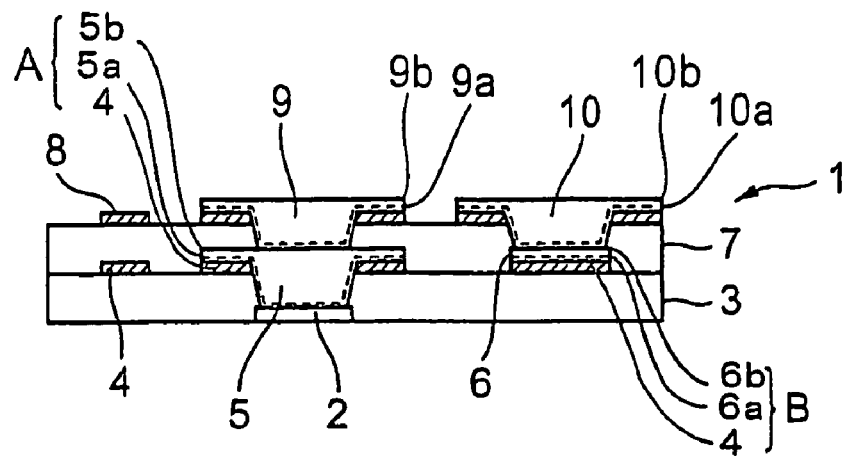
FIG. 1 is a schematic sectional diagram to explain a multilayer printed wiring board in the first embodiment of the present invention.

FIG. 1 is a schematic sectional diagram to explain a multilayer printed wiring board in the first embodiment of the present invention and shows an example of a multilayer printed wiring board 1 of a stacked structure having two buildup layers.

In FIG. 1, a first insulating layer 3 and metal foil are laminated on a lower-layer wiring circuit 2 to form a first wiring circuit 4. As the metal foil it is preferable to enumerate copper foil, aluminum foil, silver foil, tin foil, etc. However, it is preferable to use copper foil, which is inexpensive and easy to handle. In the first wiring circuit 4 (formed from metal foil alone), a barrier layer 5a and a barrier layer 6a are formed on the top surfaces of a pad portion of a first interlayer connection via 5 and a pad portion of a second interlayer via bottom 6 formed in a second insulating layer 7, respectively, and a metal plating 5b and a metal plating 6b are further provided, whereby a first insulating layer interlayer via pad A and a second insulating layer interlayer via bottom pad B are respectively formed. The first wiring circuit 4, the first insulating layer interlayer connection via pad A and the second insulating layer interlayer via bottom pad B are provided in the same surface layer, and besides, the first insulating layer interlayer via pad A and the second insulating layer interlayer via bottom pad B have the same thickness. As a result, the formation of a recess of a second interlayer connection via 10 can be suppressed and at the same time, even in a case where the metal foil used in the wiring circuit 4 is thin, it is possible to solve the problem that the interlayer connection bottom is depressed during the formation of a nonthrough hole by laser processing, for example.

The second insulating layer 7, along with metal foil, is laminated on the surface of the first wiring circuit 4, whereby a second wiring circuit 8 (formed from metal foil alone) and second interlayer connection vias 9, 10 are formed. The second interlayer connection vias 9, 10 are constituted by barrier layers 9a, 10a and metal platings 9b, 10b, respectively.

The barrier layers 5a, 6a and 9a, 10a are formed from a nonelectrolytic plating of the same kind as the metal foil plus a electrolytic nickel plating, a nonelectrolytic plating of the same kind as the metal foil plus an electrolytic silver plating, a nonelectrolytic plating of the same kind as the metal foil plus an electrolytic tin plating and the like. Or alternatively, the barrier layers 5a, 6a and 9a, 10a may be formed from a nonelectrolytic nickel plating, a nonelectrolytic silver plating, a nonelectrolytic tin plating, a plating resist and the like.

Figure 2:
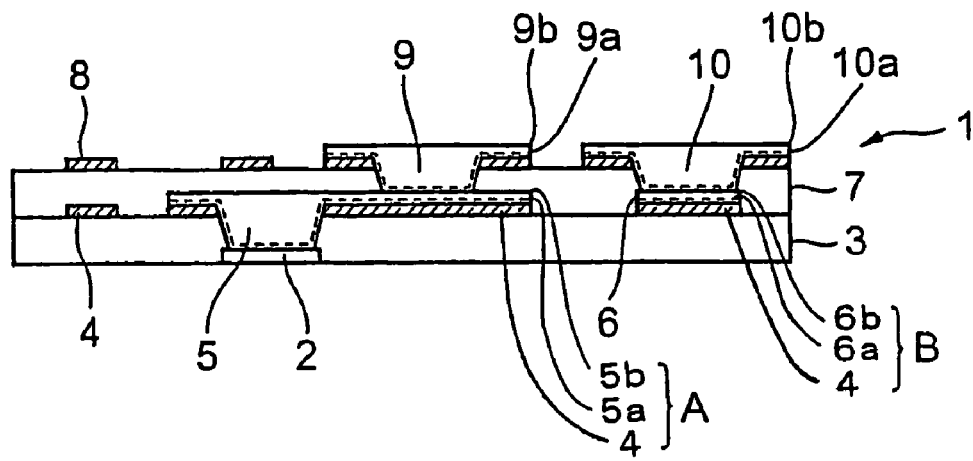
FIG. 2 is a schematic sectional diagram to explain a multilayer printed wiring board in the second embodiment of the present invention.

Next, FIG. 2 is a schematic sectional diagram to explain a multilayer printed wiring board in the second embodiment of the present invention. Although basically FIG. 2 is the same as FIG. 1, it shows an example of a multilayer printed wiring board 1 in which the connection structure between the first interlayer connection via hole and the second interlayer connection via hole is a staggered via structure.

Incidentally, in the stacked structure, the first and second interlayer connection via holes are formed in directly above and below with respect to each other, whereas in the staggered structure, the first and second interlayer connection via holes are formed in a staircase pattern.

Although in FIGS. 1 and 2 above, the descriptions were given along with an example in which the interlayer connection vias 5, 9, 10 are filled with a metal plating, it is also possible to deposit a metal plating only on an inner surface of a nonthrough hole, whereby a BVH recess is formed. And the BVH recess may be filled with the resin of an insulating layer, an electrically conductive paste, etc. Although in FIGS. 1 and 2, the descriptions were given of an example in which two buildup layers are formed on one side of the basic structure, it is needless to say that the present invention can be carried out in structures of 3 layers, 4 layers and more layers or in a both-side buildup structure.

Subsequently, a manufacturing method of the present invention will be described by using FIGS. 3(a) to 3(o).

Figure 3:
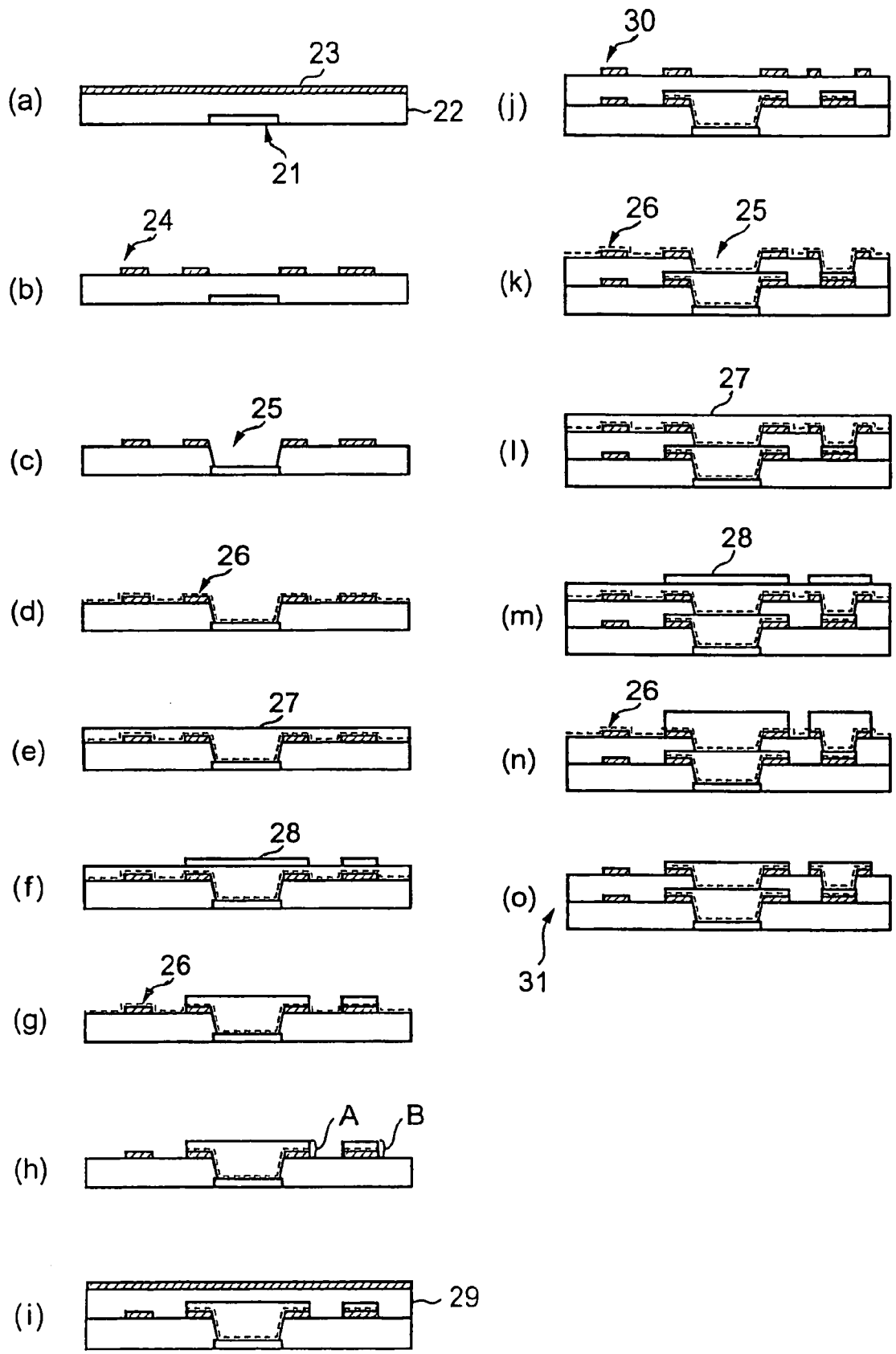
FIGS. 3(a) to 3(o) are each a schematic sectional diagram to explain the steps of a manufacturing method of the present invention.
Figure 4:
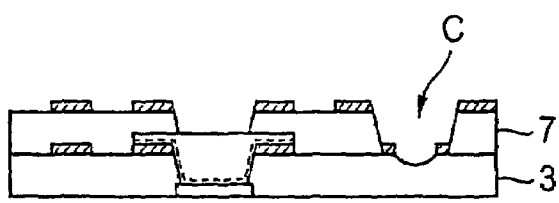
FIG. 4 is a schematic sectional diagram to explain a conventional multilayer printed wiring board.
Figure 5:
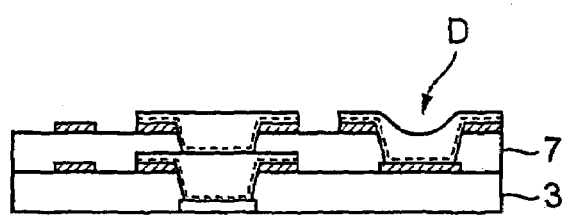
FIG. 5 is a schematic sectional diagram to explain another conventional multilayer printed wiring board.

First, as shown in FIG. 3 (a), a first insulating layer 22 and metal foil 23 are laminated on a lower-layer wiring circuit 21. Next, as shown in FIG. 3 (b), a wiring circuit 24 is formed on the metal foil 23 by the subtractive method. Next, as shown in FIG. 3 (c), a nonthrough hole 25 for interlayer connection is formed by laser processing or by the exposure and development of a photosensitive insulating resin and subjected to desemear treatment. Next, as shown in FIG. 3 (d), a barrier layer 26 is formed substantially in the whole upper area of the wiring circuit 24 and the first insulating layer 22. The barrier layer 26 is formed from a nonelectrolytic plating of the same kind as the metal foil 23 plus an electrolytic nickel plating, a nonelectrolytic plating of the same kind as the metal foil 23 plus an electrolytic silver plating or a nonelectrolytic metal plating of the same kind as the metal foil 23 plus a electrolytic tin plating and the like. Or alternatively, the barrier layer 26 may be formed from a nonelectrolytic nickel plating, a nonelectrolytic silver plating, a nonelectrolytic tin plating or a plating resist and the like.

Next, as shown in FIG. 3 (e), an electrolytic metal plating 27 is applied substantially to the whole upper area. A generally used copper plating is preferable as the electrolytic metal plating 27. Next, as shown in FIG. 3 (f), an etching resist 28 is formed by the photolithography method. As the etching resist used here, a dry film, a photosensitive liquid resin, an electrodeposited plating film, etc. can be enumerated.

Next, as shown in FIG. 3(g), after the removal of an excess electrolytic metal plating 27 by etching, the etching resist 28 is exfoliated. Next, as shown in FIG. 3 (h), the exposed barrier layer 26 is removed by etching, whereby it is ensured that the thickness of an interlayer connection via pad A formed from the wiring circuit 24 (metal foil 23), the barrier layer 26 and the electrolytic metal plating 27 and the thickness of an interlayer connection via bottom pad B similarly formed from the wiring circuit 24 (metal foil 23), the barrier layer 26 and the electrolytic metal plating 27 in a second insulating layer are made equal to each other. As a result of this, it becomes possible to form a second interlayer connection via in a flat condition without a recess. Incidentally, unless the thickness of A and B is the same, it becomes necessary to deposit an excessive metal plating to remove the recess in the step of an electrolytic metal plating, which consequently poses a problem that productivity is low.

Next, as shown in FIG. 3(*i*), a second insulating layer 29 and metal foil are laminated. Next, as shown in FIG. 3 (*j*), a second wiring circuit 30 is formed. Next, as shown in FIG. 3 (*k*), a nonthrough hole 25 is formed in the second insulating layer 29 and a barrier layer 26 is formed substantially in the whole upper area. Next, as shown in FIG. 3 (*l*), an electrolytic metal plating 27 is formed substantially in the whole upper area. Next, as shown in FIG. 3 (*m*), an etching resist 28 is formed by the photolithography method. Next, as shown in FIG. 3 (*n*), an excess of electrolytic metal plating 27 is removed by etching and the etching resist 28 is exfoliated. Next, as shown in FIG. 3 (*o*), the exposed barrier layer 26 is removed by etching, whereby a multilayer printed wiring board 31 of the present invention is completed. Incidentally, in a wiring circuit of an outermost layer, a solder resist to protect the wiring circuit from solder during the mounting of parts is formed.

What is claimed is:

1. A method of manufacturing a multilayer printed wiring board, comprising the steps of:
    preparing an insulating substrate, the front and back surfaces of which have a metal foil and forming a circuit by laminating a first insulating layer and the metal foil at least on one surface of the insulating substrate;
    forming a first nonthrough hole for a first interlayer connection in the at least one surface;
    forming a first barrier layer in the whole area of the at least one surface and the first nonthrough hole;
    forming a metal plating in the whole area of the first barrier layer;
    forming an etching resist in an interlayer connection via pad portion and an interlayer connection via bottom pad portion of an interlayer insulating layer of an upper layer;
    etching the metal plating thereby to remove an excess of the metal plating;
    exfoliating the etching resist;
    removing an exposed first barrier layer;
    forming a second insulating layer and a metal layer on the first insulating layer;
    forming a circuit;
    forming a second nonthrough hole for a second interlayer connection;
    forming a second barrier layer in the whole area of the circuit, the second nonthrough hole, and the second insulating layer;
    forming a metal plating in the whole area of the second barrier layer;
    forming an etching resist in an interlayer connection via pad portion for circuit formation in an outermost layer;
    removing an excess metal plating;
    exfoliating the etching resist; and
    removing the second barrier layer.

2. The method of manufacturing a multilayer printed wiring board according to claim 1, wherein the first barrier layer is formed from a nonelectrolytic plating of the same kind as the metal foil plus an electrolytic nickel plating, a nonelectrolytic plating of the same kind as the metal foil plus an electrolytic silver plating or a nonelectrolytic plating of the same kind as the metal foil plus an electrolytic tin plating.

3. The method of manufacturing a multilayer printed wiring board according to claim 1, wherein the first barrier layer is formed from a nonelectrolytic nickel plating, a nonelectrolytic silver plating or a nonelectrolytic tin plating.

4. The method of manufacturing a multilayer printed wiring board according to any one of claims 1 to 3, wherein the first and second nonthrough holes for interlayer connection are formed by a laser.

5. The method of manufacturing a multilayer printed wiring board according to any one of claims 1 to 3, wherein the first and second nonthrough holes for interlayer connection are formed by exposure and development of the insulating layers comprised of a photosensitive insulating resin.

6. A method of manufacturing a multilayer printed wiring board, comprising the steps of:
    preparing an insulating substrate, the front and back surfaces of which have a metal foil and forming a circuit on the insulating substrate;
    forming a first nonthrough hole for interlayer connection;
    forming a first nonelectrolytic metal plating substantially in the whole area of the front surface;
    forming a first electrolytic metal plating substantially in the whole area of the first nonelectrolytic metal;
    forming an etching resist in an interlayer connection via pad portion and an interlayer connection via bottom pad portion of an interlayer insulating layer of an upper layer;
    etching the metal plating thereby to remove an excess of the metal plating;
    exfoliating the etching resist;
    further forming an insulating layer and a metal layer on the insulating substrate;
    forming a circuit;
    forming a second nonthrough hole for interlayer connection;
    forming a second nonelectrolytic metal plating substantially in the whole area of the circuit, the second nonthrough hole, and the insulating layer;
    forming a second electrolytic metal plating substantially in the whole area of the second nonelectrolytic metal;
    forming an etching resist in an interlayer connection via pad portion for circuit formation in an outermost layer;
    removing an excess of metal plating; and
    exfoliating the etching resist.

7. The method of manufacturing a multilayer printed wiring board according to claim 6, wherein the first and second nonthrough holes for interlayer connection are formed by a laser.

8. The method of manufacturing a multilayer printed wiring board according to claim 6, wherein the first and second nonthrough holes for interlayer connection are formed by exposure and development of the insulating layers comprised of a photosensitive insulating resin.

* * * * *